United States Patent [19]
Kim et al.

[11] Patent Number: 5,234,857
[45] Date of Patent: Aug. 10, 1993

[54] METHOD OF MAKING SEMICONDUCTOR DEVICE HAVING A CAPACITOR OF LARGE CAPACITANCE

[75] Inventors: Sung-tae Kim; Hyeung-gyu Lee; Jae-hong Ko, all of Seoul, Rep. of Korea

[73] Assignee: Samsung Electronics, Co., Ltd., Rep. of Korea

[21] Appl. No.: 880,736

[22] Filed: May 8, 1992

Related U.S. Application Data

[63] Continuation of Ser. No. 843,629, Feb. 18, 1992.

[30] Foreign Application Priority Data

Mar. 23, 1991 [KR] Rep. of Korea ............... 91-4638
Dec. 19, 1991 [KR] Rep. of Korea ............... 91-23473

[51] Int. Cl.$^5$ ............................................. H01L 21/70
[52] U.S. Cl. ........................................ 437/47; 437/52; 437/60; 437/89; 437/233; 437/919
[58] Field of Search ................... 437/47, 48, 52, 60, 437/89, 228, 233, 919; 148/DIG. 138; 357/23.6

[56] References Cited

U.S. PATENT DOCUMENTS

| | | | |
|---|---|---|---|
| 4,578,142 | 3/1986 | Corboy, Jr. et al. | 437/89 |
| 4,698,316 | 10/1987 | Corboy, Jr. et al. | 437/89 |
| 5,068,199 | 11/1991 | Sandhu | 437/919 |
| 5,112,773 | 5/1992 | Tuttle | 437/919 |

Primary Examiner—Tom Thomas

[57] ABSTRACT

Disclosed is a semiconductor device having a capacitor of large capacitance. The capacitor includes a first electrode portion which has a conductive structure formed on a semiconductor substrate, an insulating layer with pinholes in the conductive structure, and a conductive silicon layer grown through the pinholes, a second electrode portion on the first electrode portion, and a dielectric film formed between the first and second electrode portions. A method for manufacturing the device includes the steps of forming the first electrode portion by forming the conductive structure, forming the insulating layer, growing a silicon through the pinholes to form a conductive silicon layer, and forming the dielectric film and the second electrode portion. The capacitor can be formed with various shapes and is increased to 1.5 times or greater in capacitance while maintaining reliability comparable to that of a conventional one.

15 Claims, 9 Drawing Sheets

METHOD OF MAKING SEMICONDUCTOR DEVICE HAVING A CAPACITOR OF LARGE CAPACITANCE

This is a divisional of co-pending application Ser. No. 07/843,629 filed Feb. 18, 1992.

BACKGROUND OF THE INVENTION

The present invention relates to a semiconductor device and a manufacturing method thereof, and particularly to a semiconductor device having a capacitor of large capacitance formed on a semiconductor substrate, and a method for manufacturing the same.

A dynamic random access memory (DRAM) in which a memory cell has a single MOS transistor and a signal MOS capacitor, can be given as one example of a memory device formed on a semiconductor substrate. In such a DRAM, the storage of information is carried out by storing a charge in a MOS capacitor. Also, the stored information is read out by discharging the MOS capacitor onto a bit line through an MOS transistor, thereby detecting the potential variances.

Recently, considerable progress has been achieved in the miniaturization and high packing density of DRAMs, along with the advance in semiconductor technology. The main concern for achieving high packing density in a DRAM is how to manufacture a capacitor with a large capacitance while minimizing the memory cell area.

It is well known that the capacitance of a capacitor is in direct proportion to the dielectric constant and the surface area of a dielectric film, and in inverse proportion to the thickness of the dielectric film.

Accordingly, in order to increase the capacitance, it is required to make the dielectric film thinner, to use an insulating layer of greater dielectric constant, or to enlarge the surface area of the dielectric film. However, thinning the insulating layer to increase the capacitance of the capacitor is undesirable since this would decrease the reliability of the semiconductor device. Although a method has been suggested which utilizes an insulating layer having a high dielectric constant such as tantalum oxide ($Ta_2O_5$) film as the dielectric film, this method has not yet become practical.

Therefore, the enlargement of the capacitor's area is the preferable method to increase the capacitance of the capacitor. Vigorous researches to increase the effective area of a capacitor have been carried out, and various methods are proposed. For example, a method for forming capacitor having a storage electrode in a trench formed by etching a semiconductor substrate, or for forming a capacitor having a stacked-capacitor structure is employed.

Recently, a proposal in which the capacitance can be increased without enlarging the cell area or heightening the storage electrode, has been presented and has drawn a great deal attention. In published research literature ("Extended Abstracts of the 22nd on Solid State Device and Materials," 1990, pages 869 to 872 written by Yoshio Hayashide et al., and pages 873 to 876 by H. Watanabe et al.) there is disclosed a technique providing a polycrystalline silicon layer having an uneven surface as a storage electrode to enlarge the storage electrode's surface area due to its unevenness.

FIG. 1 illustrates a sectional view of a stacked capacitor having such an uneven surface. According to the method of Watanabe et al., first, a field oxide layer 2 is grown on a silicon substrate 1 by a LOCOS method. A first polycrystalline silicon layer doped with an impurity is then formed as a gate electrode 3, followed a source region 4 and a drain region 5 being formed by ion implantation. Then, an oxide layer 6 is formed as an insulating layer. Thereafter, to form a storage electrode 7 serving as a first electrode of a capacitor, polycrystalline silicon is deposited by a low pressure chemical vapor deposition (LPCVD) at a temperature of 550° C., thereby forming a first polycrystalline silicon layer. The specific temperature 550° C. corresponds to the transition temperature of the structure at which silicon is transited from amorphous to polycrystalline. The surface area of the polycrystalline silicon layer deposited at the above-mentioned temperature is twice as large as that deposited at some other temperature.

A photoresist (not shown) is coated on the first polycrystalline silicon layer, and is exposed and developed through a mask, thereby forming a photoresist pattern. After that, storage electrode 7 is formed by etching the first polycrystalline silicon layer using the photoresist pattern as an etching mask, and then the photoresist pattern is removed. Successively, the oxide/nitride layer as a dielectric film 8 is formed on storage electrode 7, and a plate electrode 9 as a second electrode of the capacitor is formed by depositing a polycrystalline silicon on dielectric film 8 to form a second polycrystalline layer.

According to the above-described method, the polysilicon layer is applied to the storage electrode of a stacked capacitor structure, which enables the capacitance to be doubled. Further, Yoshio Hayashide et al. teach the increase of capacitance by 1.5 times when the storage electrode is formed by depositing the polysilicon at 575° C., relative to that of a conventional polysilicon storage electrode.

However, in manufacturing a capacitor according to the above-stated method, the temperature needs to be precisely controlled during depositing the polysilicon. Also, the thickness of the polycrystalline silicon layer constituting the storage electrode of the capacitor is an important factor for controlling the unevenness of the surface thereof, which in turn causes difficulty in manufacturing a capacitor having various structures. Additionally, since the patterning is performed by a photolithography and etching process after depositing, the surface of the etched sidewall becomes even, thereby decreasing the effect.

Therefore, to accomplish the present invention, the inventors of this application have studied the foregoing examples to solve the above-mentioned problems.

SUMMARY OF THE INVENTION

Accordingly, it is the object of the present invention to provide a semiconductor device and manufacturing method thereof, which includes a capacitor of large capacitance having various shapes, unaffected by the thickness of a lower electrode of the capacitor.

To achieve the above and other objects of the present invention, there is provided a semiconductor device having a capacitor comprising: a first electrode portion which includes a conductive structure formed on a semiconductor substrate, an insulating layer having pinholes formed on the conductive structure, and a conductive silicon layer grown through the pinhole; a second electrode portion formed on the first electrode portion; and a dielectric film formed between the first and second electrode portions. Additionally, according to the present invention, there is provided a method comprising forming a first electrode portion by forming a conductive structure on a semiconductor substrate, forming an insulating layer having pinholes on the conductive structure, and growing silicon through the pinholes to form a conductive silicon layer, forming a dielectric film on the grown silicon layer and forming a second electrode portion thereon.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE INVENTION

Figure 1:
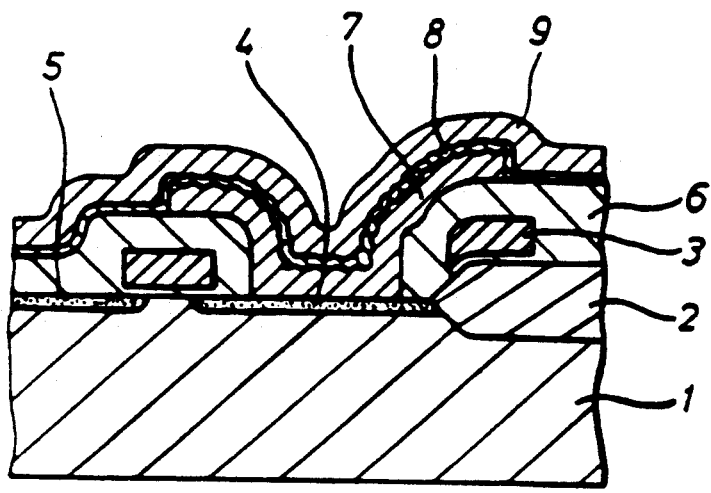
FIG. 1 is a sectional view of a conventional semiconductor device having a stacked capacitor structure whose surface is uneven.
Figure 2:
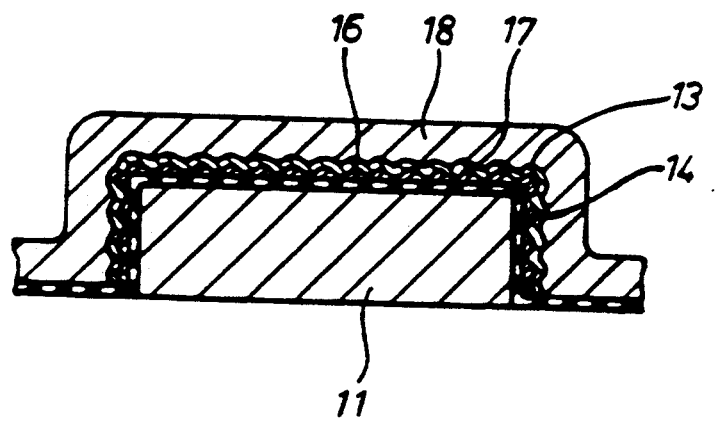
FIG. 2 is a sectional view of a capacitor manufactured by a method according to the present invention.

FIG. 2 illustrates a sectional view of a capacitor manufactured by the method according to the present invention.

In FIG. 2, a reference numeral 11 designates a conductive structure; 13 designates an insulating layer including pinholes formed on the conductive structure 11; 14 designates pinholes; 16 designates conductive silicon grown through pinholes 14; 17 designates a dielectric film; and 18 designates a second electrode portion.

The conductive structure may be composed of a doped polysilicon or an ion-implanted single crystalline silicon. Preferably, the conductive structure is formed of a polycrystalline silicon implanted with an impurity.

Any insulating layer may be used in the present invention as long as it contains pinholes and the silicon layer can be selectively grown through the pinholes, and in particular, a silicon nitride layer is preferable. It is well known that this silicon nitride layer itself has pinholes. The silicon nitride layer is preferably formed by a chemical vapor deposition (CVD). Also, the silicon nitride layer may have increased pinhole density by performing thermal treatment.

The silicon nitride layer is desirably 30Å to 500Å thick. When the thickness of the silicon nitride layer is below 30Å, it is insufficient to serve as a mask while growing the silicon. On the other hand, when the thickness of the silicon nitride layer is beyond 500Å, the number of pinholes is decreased, thereby causing difficulties in growing the conductive silicon layer.

A too-thin conductive silicon layer lessens the roughness of the surface, making it difficult for capacitance to be increased, while on the other hand, a too-thick conductive silicon layer decreases the capacitor area, thus reducing its capacitance. Accordingly, the thickness of the grown silicon layer is preferably 50Å to 500Å.

The dielectric film is not restricted in type, provided that it is a general insulating layer capable of being used in semiconductor devices. For example, the dielectric film may consist of an oxide/nitride/oxide (ONO).

The second electrode as a plate electrode is also free from restriction in conductive material type, but is preferably composed of a polysilicon.

Embodiments of the capacitor of large capacitance of the semiconductor device according to the present invention is illustrated in FIGS. 3A through 3E.

Figure 3A:
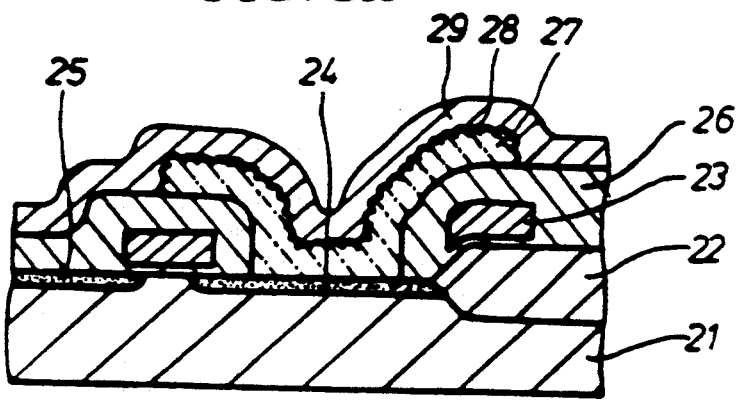
FIGS. 3A through 3E are sectional views showing the embodiments of a semiconductor device having a capacitor of large capacitance according to the present invention.
Figure 3B:
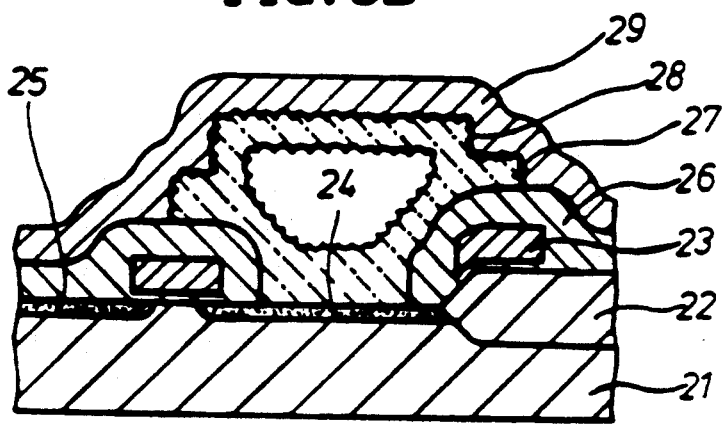
Figure 3C:
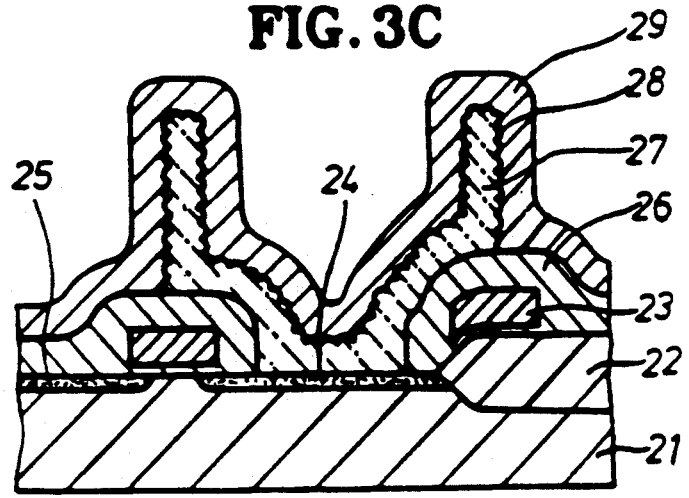
Figure 3D:
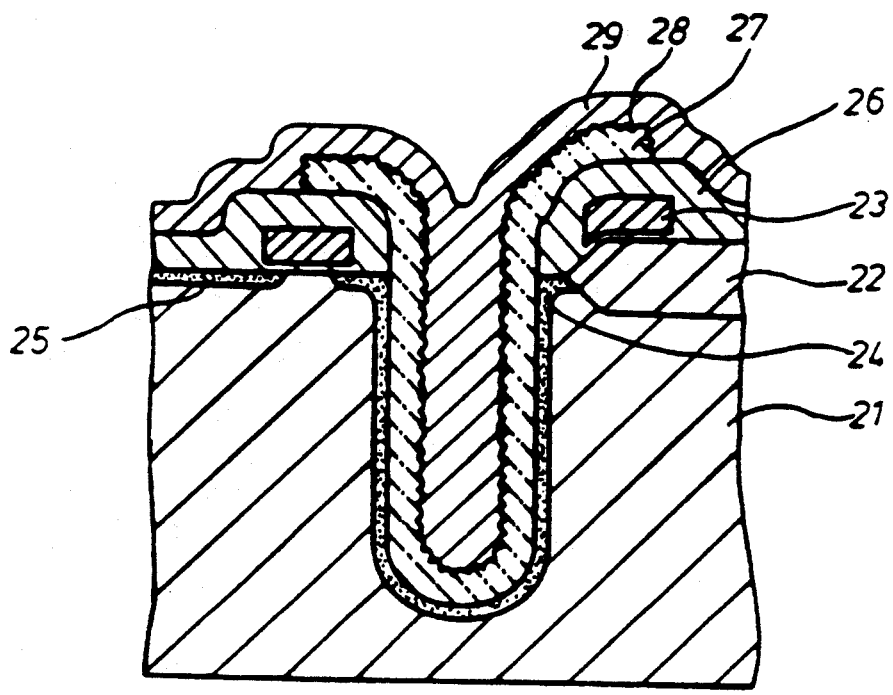
Figure 3E:
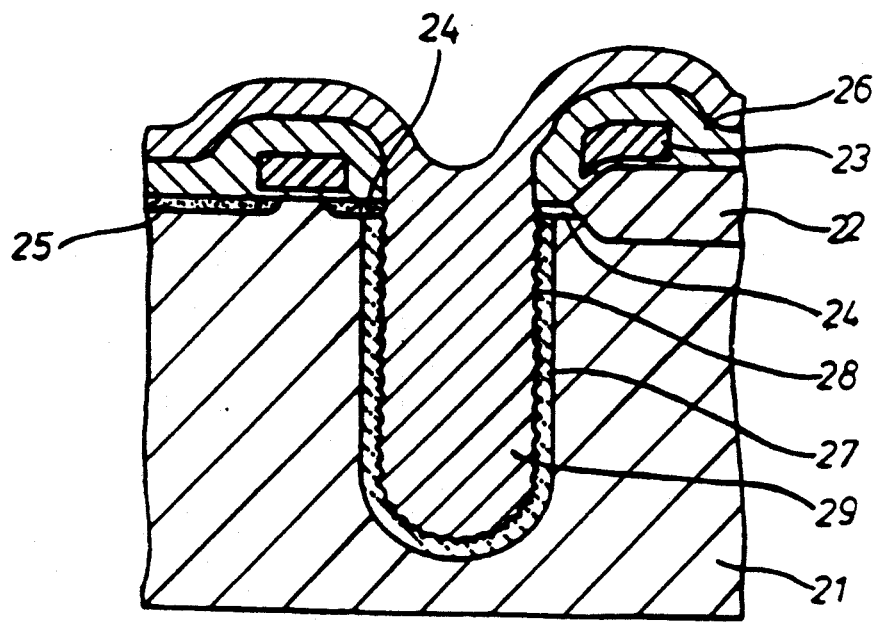

FIG. 3A is a sectional view of a semiconductor device of a stacked capacitor structure; FIG. 3B is a hollow-type capacitor structure; FIG. 3C is a cylinder-type capacitor structure; FIG. 3D is a stacked trench capacitor structure; and FIG. 3E is a trench-type capacitor structure.

In FIGS. 3A through 3E, a reference numeral 21 designates a silicon substrate; 22 designates a selectively grown field oxide layer; 23 designates a gate electrode; 24 and 25 designate source and drain regions; 26 designates an insulating layer; 27 designates a first electrode portion comprising an insulating layer having pinholes (not shown) and a silicon layer (the uneven surface portion) grown through the pinholes; 28 designates a dielectric film; and 29 designates a second electrode portion.

FIGS. 3A through 3C illustrate sectional views of semiconductor devices wherein polycrystalline silicon is used to form the conductive structure of the first electrode of the capacitor. FIG. 3D illustrates a sectional view of semiconductor device wherein a trench is formed in the semiconductor substrate, and the conductive structure is formed on the inner surface of the trench. FIG. 3E illustrates a sectional view of the semiconductor device having a first electrode obtained by forming a trench in the doped silicon substrate, forming the insulating layer including the pinholes on the inner surface of the trench, and then, growing the silicon layer.

The present invention may be embodied in all general semiconductor devices having capacitors.

Now, a method for manufacturing the semiconductor device of the present invention will be described in detail.

According to the present invention, the first electrode portion is formed by forming the conductive structure on the semiconductor substrate, forming the insulating layer having the pinholes on the conductive structure, and growing the silicon through the pinholes to form a conductive silicon layer, and then, the dielectric film and the second electrode portion are formed on the grown silicon layer.

The conductive structure may be formed of the polycrystalline silicon as described above.

For example, after depositing the polysilicon on the semiconductor substrate, an impurity is implanted, and a pattern having a predetermined shape is obtained by a conventional lithography process. The polysilicon is commonly deposited by thermally decomposing silane ($SiH_4$) within the temperature range of 580° to 650° C. The polysilicon is preferably deposited by LPCVD in view of uniformity, purity, and economic aspects. After depositing the polysilicon, a resist is coated to form a resist pattern by a conventional lithography process. Using the resist pattern as an etching mask, a polysilicon pattern is formed by anisotropic etching.

The polysilicon pattern as the conductive structure may be formed on inner surface of the trench formed in the semiconductor substrate. The deposition of the polysilicon is performed by the same method as described above. After depositing the polysilicon, conduction is endowed by ion-implantation.

The conductive structure may be formed on a single-crystalline silicon substrate. For example, a trench is formed in the silicon substrate, and conduction is endowed by ion-implanting to the inside of the trench. The ion-implanted portion of the inside of the trench is able to be used as the conductive structure of the present invention.

The insulating layer including the pinholes is formed on the conductive structure formed as above. The insulating layer is preferably a silicon nitride layer. The pinholes are formed in the silicon nitride. In the present invention, it is desirable that the depositing condition is set such that the pinhole density is reasonable. The silicon nitride layer is preferably deposited by LPCVD at 700° to 800° C., using $SiCl_2H_2+NH_3$ system, for example. The thickness of the deposited silicon nitride layer is preferably 30Å to 500Å. When the silicon nitride layer is deposited too thickly, or the density of the pinholes is excessively low, the surface of the conductive structure with the silicon nitride layer coated thereon is thermally oxidized. Then, a silicon oxide layer is formed while increasing the pinhole density of the nitride layer. That is, during the oxidation process, pinholes are newly formed or the silicon nitride layer is cracked due to the consumption of the silicon nitride layer. This phenomenon is noticeable when the conductive structure is composed of polisilicon. Therefore, the oxidation process is preferably performed such that the process conditions are varied in accordance with the thickness of the silicon nitride layer or the depositing conditions, thereby allowing the pinholes to be of a predetermined density.

As with a thinner nitride layer, oxidation can be carried out at a lower temperature and within a shorter time. Oxidation is preferably performed at 800° to 950° C. for 20-40 minutes in the presence of $H_2O$.

The silicon oxide layer formed by aforesaid oxidation process is removed by a wet etching, using HF or a buffered HF mixture ($NH_4F:HF=6:1$).

Using the insulating layer as a mask, the silicon is selectively grown by a selective epitaxial growth (SEG) or selective polysilicon growth (SPG) method through the pinholes formed in the insulating layer. In this case, the silicon is not grown on the silicon nitride layer, but is grown only at those portions where the silicon is exposed, i.e., the pinholes.

The polysilicon may be grown at 800°-900° C. at a pressure of 0-100 Torr, using a $HCl+SiH_2Cl_2$ system as a source. Meanwhile, when the single-crystalline silicon is grown by the SEG method, it can be grown beyond 900° C.

The silicon layer formed by growing silicon is preferably 50Å-500Å thick. The thinner the grown silicon layer is, the less sufficient the increase in the capacitance is. Overly thick silicon layer causes the decrease of the surface area of the capacitor, thereby reducing the capacitance of the capacitor.

After growing the silicon, the partially exposed insulating layer may be removed by a wet etching method.

After growing the silicon, an ion-implantation process may be performed to endow conduction to the first electrode portion.

After growing the silicon to form a conductive silicon layer, a dielectric film is formed on the conductive silicon layer and second conductive material are deposited on the dielectric film, thereby forming the second electrode portion.

The dielectric film used in the present invention includes for example $Ta_2O_5$ film, NO film, ONO film, $SiO_2$ film, or $Si_3N_4$ film.

The second electrode portion can be formed of the polycrystalline silicon. The polycrystalline silicon is deposited on the dielectric layer, and then ion-implantation is performed to endow conduction.

Now, a method of the present invention will be described in detail with reference to the drawings.

FIGS. 4A through 4F illustrate an embodiment of the method for manufacturing a capacitor included in the semiconductor device according to the present invention.

Figure 4A:
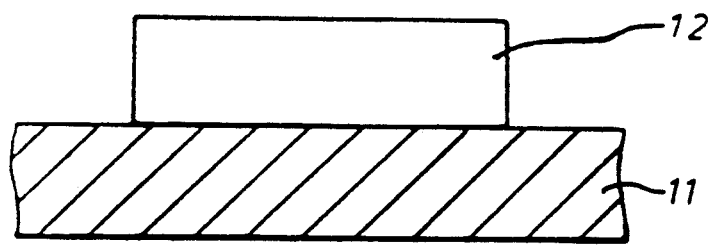
FIGS. 4A through 4F are schematic views of a method for manufacturing a capacitor included in the semiconductor device according to the present invention.

FIG. 4A illustrates a process for forming the conductive structure on the semiconductor substrate. The polycrystalline silicon is deposited to form a polycrystalline silicon layer on the semiconductor substrate by LPCVD, and then an impurity is implanted. Thereafter, a photoresist is coated on the surface of deposited polycrystalline silicon layer 11, then, exposed and developed using an unshown mask, thereby forming photoresist pattern 12.

Figure 4B:
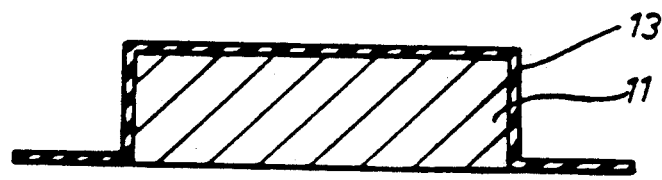

FIG. 4B illustrates the conductive structure with silicon nitride layer 13 coated thereon. The polysilicon layer 11 is anisotropically etched using photoresist pattern 12 as an etching mask and photoresist pattern 12 is removed. Thus, the conductive structure is formed, and then, silicon nitride layer 13 having a thickness of 50Å is formed on the conductive structure by the LPCVD method at 790° C., using a $NH_3+SiH_2Cl_2$ system as a source.

Figure 4C:
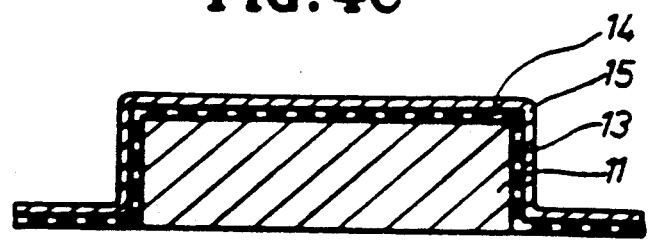

FIG. 4C illustrates a process for forming silicon oxide layer 15 on the silicon nitride layer 13 by oxidizing the surface of the conductive structure on which the nitride layer is formed. After forming the silicon nitride layer 13, when the surface of the conductive structure is thermally oxidized at 800°-950° C. in the presence of $H_2O$, silicon oxide layer 15 is formed, and the pinholes are newly formed or the nitride layer is partially cracked.

Figure 4D:
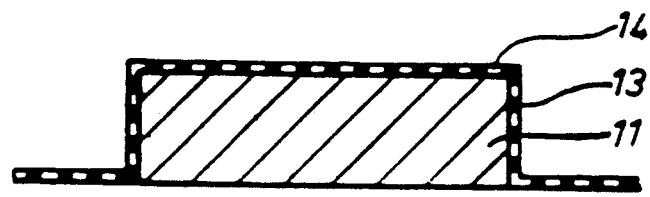

FIG. 4D illustrates a process for removing the silicon oxide layer 15. Here, silicon oxide layer 15 formed on silicon nitride layer 13 is removed by a wet etching using an HF or a buffered HF mixture.

Figure 4E:
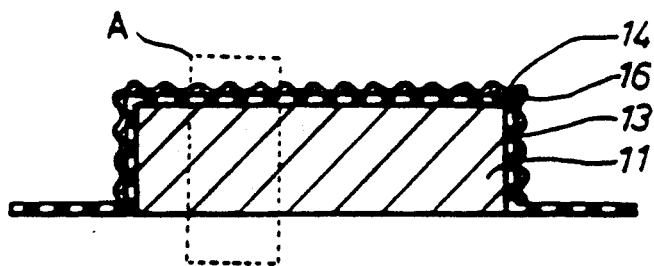

FIG. 4E illustrates a process for selectively growing the silicon. According to a SPG method using a $HCl+SiH_2Cl_2$ system as a source, the silicon under the silicon nitride layer is selectively grown on the surface of silicon nitride layer 13 through pinholes 14 at 800° C. at a pressure of 80 Torr to form a silicon layer 16. At this time, the silicon cannot be grown on nitride layer 13, but only through pinhole 14. The thickness of grown silicon layer 16 is 50Å–500Å.

Figure 5:
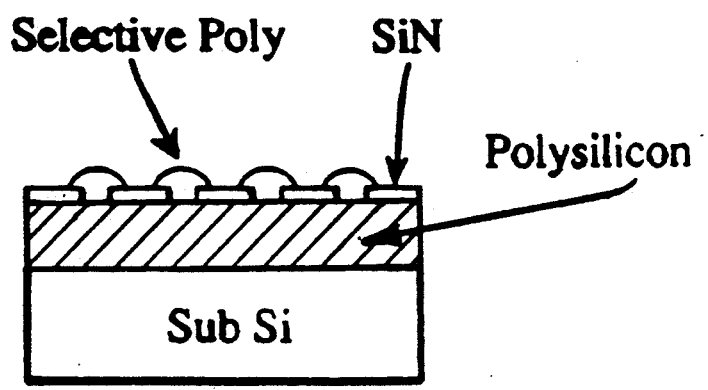
FIG. 5 is an enlarged view of the dotted portion of FIG. 4E.

FIG. 5 is an enlarged view of the dotted portion extracted from FIG. 4E wherein the silicon has grown up through the pinholes to partially cover the upper surface of the silicon nitride layer 13. The exposed portion of the silicon nitride layer may be removed using an etchant.

Figure 4F:
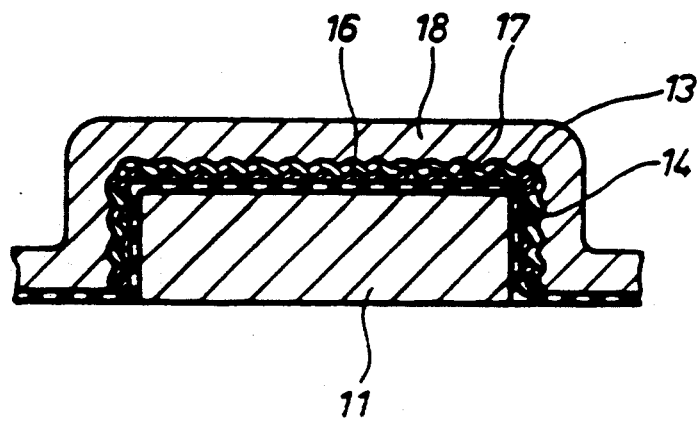

FIG. 4F illustrates the capacitor formed by using the grown silicon. After growing the silicon, dielectric film 17 having an ONO structure is formed, and second electrode portion 18 of the capacitor is formed using the polycrystalline silicon, thereby completing the capacitor.

Figure 6A:
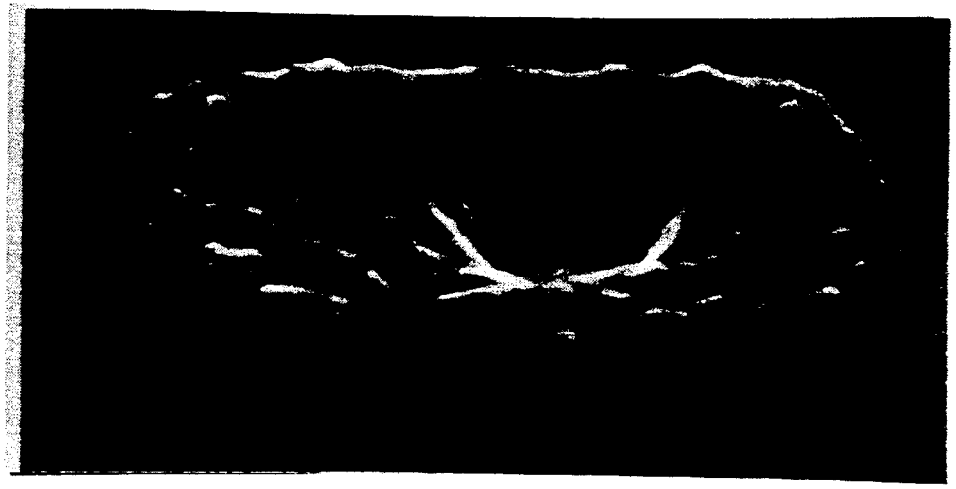
FIG. 6A shows an SEM picture of the capacitor formed on a semiconductor wafer manufactured by the method of the present invention.
Figure 6B:
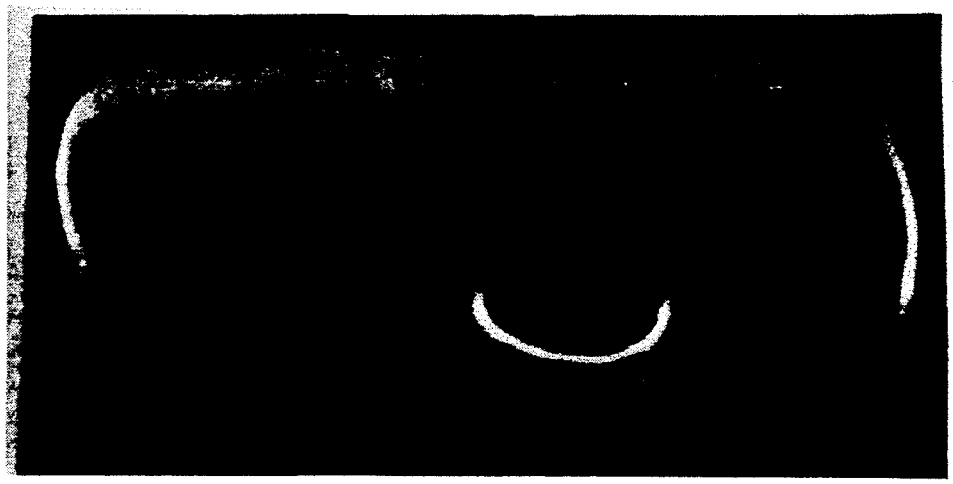
FIG. 6B shows an SEM picture of the capacitor having an even surface manufactured by the conventional method.

FIG. 6A is an SEM picture of the capacitor formed on the semiconductor wafer according to the method of the present invention. On the other hand, FIG. 6B is an SEM picture of the capacitor manufactured by the conventional method in which the silicon is not grown through the pinholes. In the above pictures, it is noted that the surface of the capacitor manufactured by the present invention is uneven.

Figure 7:
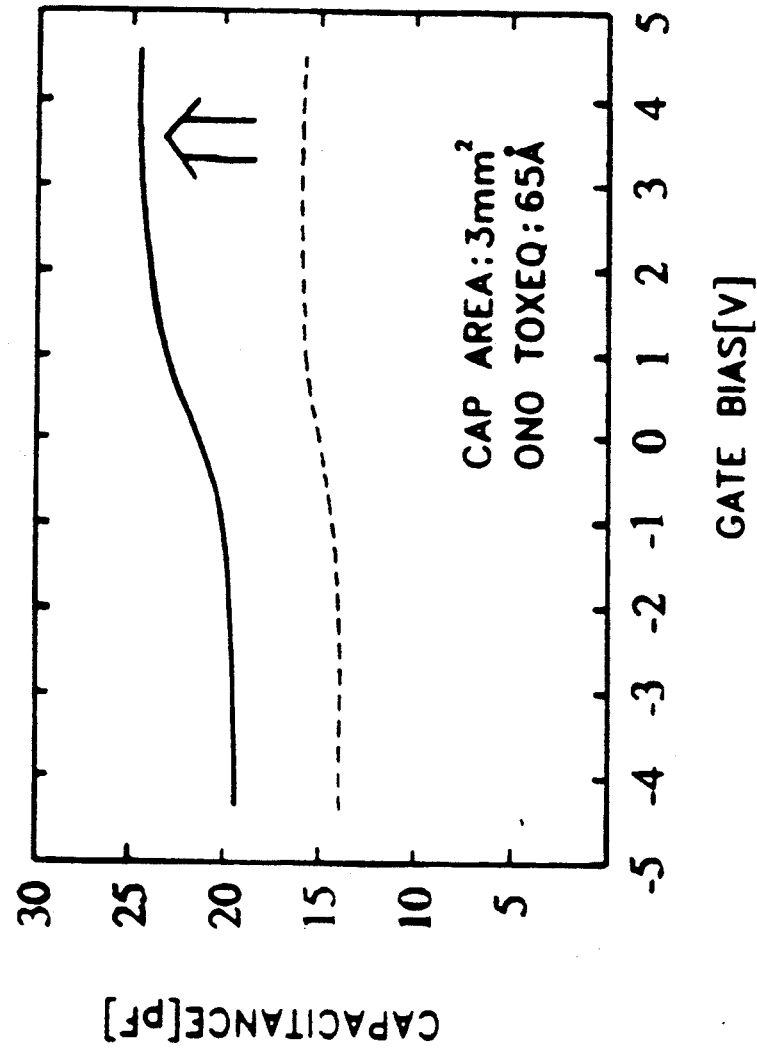
FIG. 7 is a graphical representation for showing the capacitances of the capacitors measured using the capacitors shown in FIGS. 6A and 6B.

The result of measuring the capacitances of the capacitors shown in FIGS. 6A and 6B is illustrated in FIG. 7.

In FIG. 7, the dotted line represents the capacitance of the conventional capacitor, and the solid line represents the capacitance of the capacitor according to the present invention. In this graph, the capacitance of the present invention increases about 1.7 capacitor. However, the capacitance can be further increased to more than 2 times in accordance with adjusting the thickness of the silicon layer.

Moreover, when roughening the surface of the storage electrode by depositing the polysilicon at a predetermined temperature, since the patterning process is performed after depositing, the surface of the sidewall portion cannot be uneven. However, in the capacitor of the present invention, the silicon layer is grown throughout the whole surface of the first electrode portion including the sidewall surface portion, i.e., the entire surface of the storage electrode portion, so that the capacitance of the capacitor is further increased. Moreover, in the capacitor of the present invention, a conductive structure is formed on a semiconductor wafer, and then, the capacitor is manufactured using the structure. Therefore, the capacitor structure of various kinds can be formed as shown in FIGS. 3A through 3E.

Figure 8:
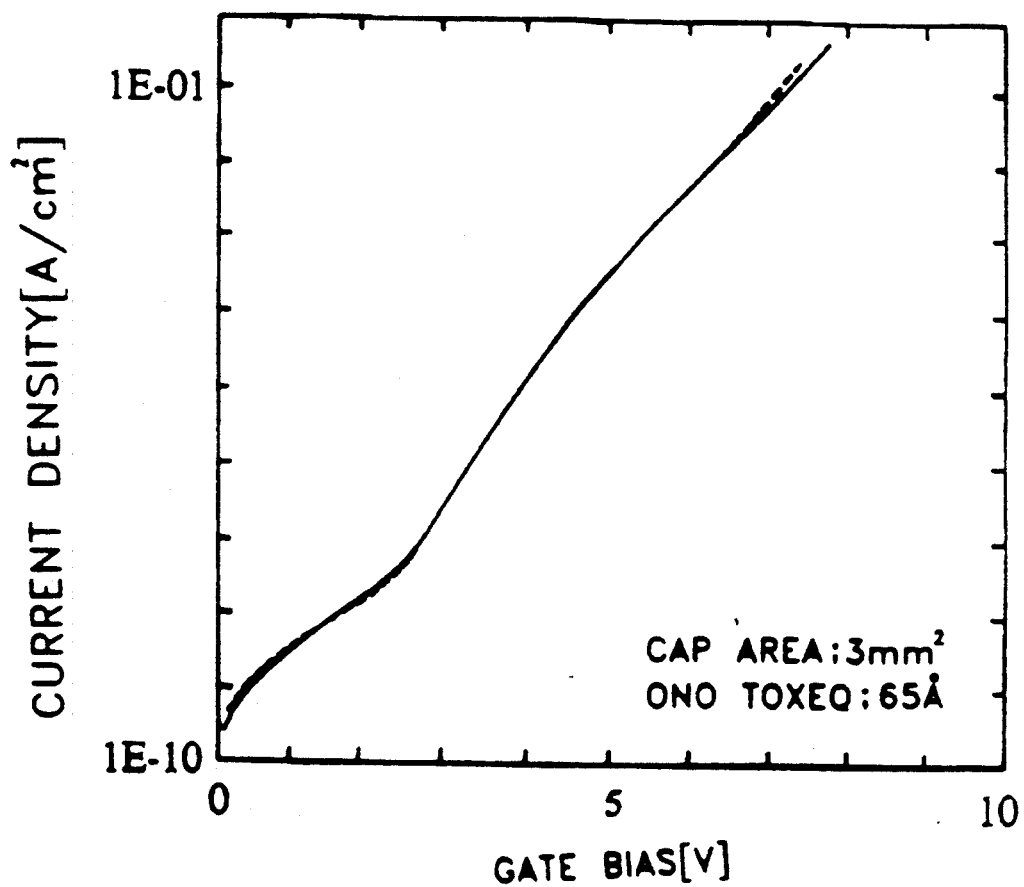
FIG. 8 represents the current-voltage characteristics of the capacitors shown in FIGS. 6A and 6B.

FIG. 8 illustrates the current-voltage characteristics of the capacitor of the present invention obtained by the above and those of the conventional capacitor. In this graph, the longitudinal axis represents current density [A/cm$^2$], and the traverse axis represents gate bias voltage [V]. It can be noted that the current-voltage characteristic of the capacitor of the present invention is almost the same as that of the conventional capacitor.

Figure 9:
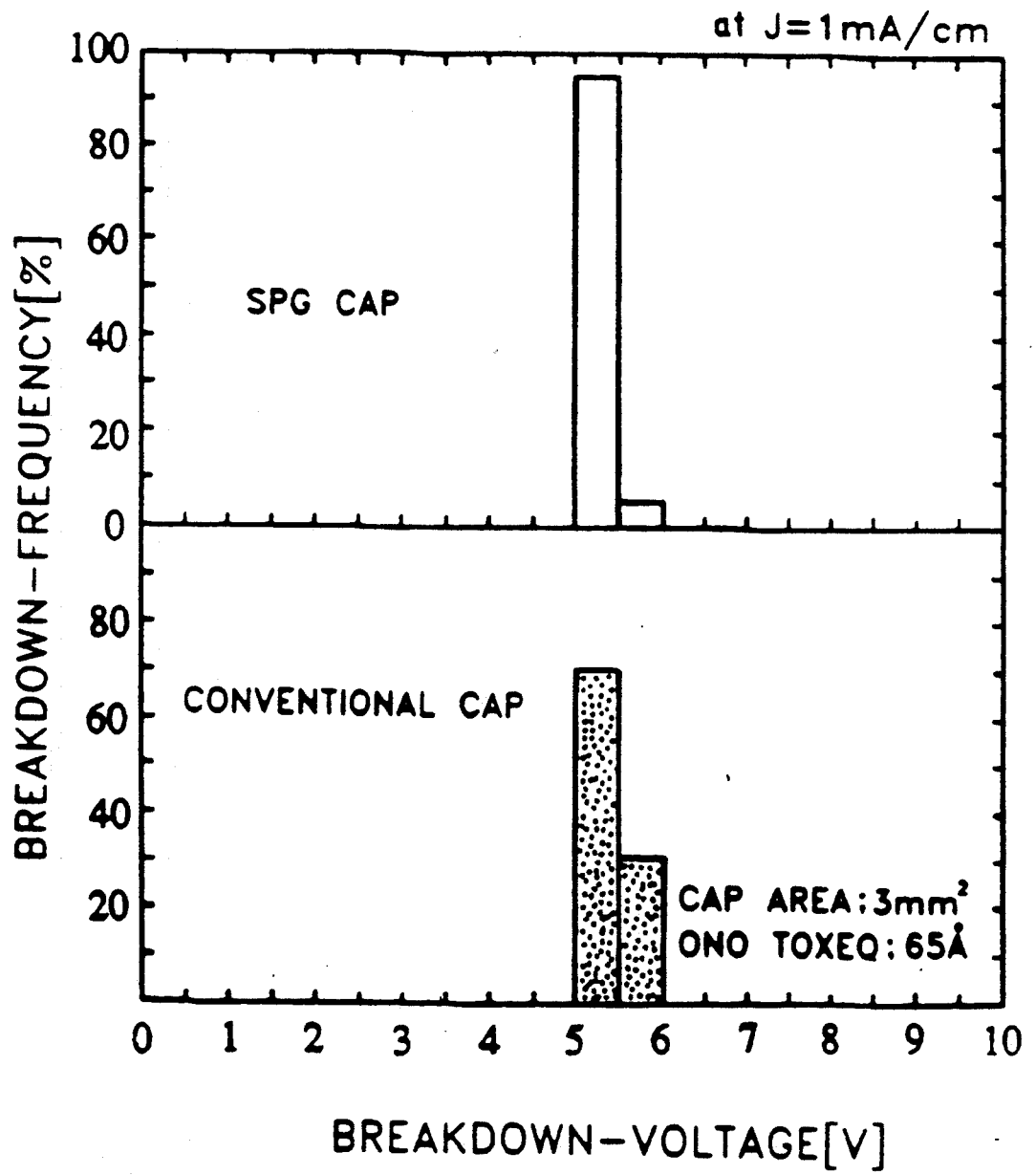
FIG. 9 represents the breakdown voltage distribution of the capacitors shown in FIGS. 6A and 6B.

FIG. 9 illustrates the breakdown voltage distributions of the capacitor of the present invention and those of the conventional capacitor. As illustrated in this drawing, the peak of the breakdown field distribution is sharp and no breakdown failure in low electric fields is observed.

As apparent in the foregoing description, the capacitance of the capacitor according to the present invention is increased to 1.5 times or more relative to that of the conventional capacitor, while maintaining a reliability almost the same as the conventional. As a result, the present invention is enough to be adopted in a semiconductor device (e.g., DRAMs) of next generation.

What is claimed is:

1. A method for manufacturing a semiconductor device having a capacitor comprising the steps of:
   forming a first electrode portion of the capacitor by forming a conductive structure on the semiconductor substrate, forming an insulating layer having pinholes on said conductive structure, and growing a silicon through said pinholes to form a conductive silicon layer;
   forming a dielectric film on said grown silicon layer; and
   forming a second electrode portion of the capacitor thereon.

2. A method for manufacturing a semiconductor device as claimed in claim 1, wherein said conductive structure is composed of polysilicon.

3. A method for manufacturing a semiconductor device as claimed in claim 2, wherin said conductive structure is a polysilicon pattern formed by depositing said polysilicon on said semiconductor substrate, implanting an impurity, and performing a lithography process.

4. A method for manufacturing a capacitor of a semiconductor device as claimed in claim 1, wherein said conductive structure is formed on a single-crystalline silicon substrate.

5. A method for manufacturing a capacitor of a semiconductor device as claimed in claim 4, wherein said conductive structure is formed by the steps of: covering said insulating layer for etching on a single-crystalline silicon substrate; forming an opening in said insulating layer; forming a trench by etching said silicon substrate; and implanting an impurity into the inside of said trench.

6. A method for manufacturing a capacitor of a semiconductor device as claimed in claim 1, wherein said insulating layer is a silicon nitride layer.

7. A method for manufacturing a capacitor of a semiconductor as claimed in claim 6, wherein said silicon nitride layer is deposited to a thickness of 30Å to 500Å by low-pressure chemical vapor deposition.

8. A method for manufacturing a capacitor of a semiconductor as claimed in claim 6 or 7, wherein the surface of said conductive structure with said silicon nitride layer formed thereon is thermally oxidized.

9. A method for manufacturing a capacitor of a semiconductor as claimed in claim 8, wherein the oxide layer formed on said silicon nitride layer is selectively removed.

10. A method for manufacturing a capacitor of a semiconductor as claimed in claim 9, wherein said oxide layer is removed via a wet etching using any one selected from a group consisting of HF and a buffered HF mixture.

11. A method for manufacturing a capacitor of a semiconductor as claimed in claim 1, wherein said silicon is grown through any one method selected from a group consisting of selective epitaxial growth and selective polysilicon growth.

12. A method for manufacturing a capacitor of a semiconductor as claimed in claim 11, wherein the thickness of said grown silicon layer is 50Å to 500Å.

13. A method for manufacturing a capacitor of a semiconductor device as claimed in claim 1, wherein said insulating layer being partially exposed is removed by a wet etching after growing said silicon.

14. A method for manufacturing a capacitor of a semiconductor device as claimed in claim 1, wherein said first electrode portion is formed by ion-implantation after growing said silicon.

15. A method for manufacturing a capacitor of a semiconductor device as claimed in claim 1, wherein said second electrode portion is formed by depositing a polycrystalline silicon.

* * * * *